(12) United States Patent  (10) Patent No.: US 9,673,335 B2
Kamata  (45) Date of Patent: Jun. 6, 2017

(54) RECTIFIER CIRCUIT INCLUDING TRANSISTOR WHOSE CHANNEL FORMATION REGION INCLUDES OXIDE SEMICONDUCTOR

(75) Inventor: Koichiro Kamata, Isehara (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 1341 days.

(21) Appl. No.: 13/034,722

(22) Filed: Feb. 25, 2011

(65) Prior Publication Data

US 2011/0216566 A1 Sep. 8, 2011

(30) Foreign Application Priority Data

Mar. 5, 2010 (JP) .................................. 2010-049159

(51) Int. Cl.
*H02M 7/217* (2006.01)
*H01L 29/786* (2006.01)
(Continued)

(52) U.S. Cl.
CPC ...... *H01L 29/7869* (2013.01); *H01L 27/1225* (2013.01); *H01L 27/0629* (2013.01); *H01L 27/0817* (2013.01)

(58) Field of Classification Search
CPC .............................. H02M 7/217; H01L 21/336
(Continued)

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1607900 A   12/2005
EP   1737044 A   12/2006
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.
(Continued)

*Primary Examiner* — Adolf Berhane
*Assistant Examiner* — Afework Demisse
(74) *Attorney, Agent, or Firm* — Robinson Intellectual Property Law Office; Eric J. Robinson

(57) ABSTRACT

In a rectifier circuit, by using a transistor whose off-state current is small as a so-called diode-connected MOS transistor included in the rectifier circuit, breakdown which is caused when a reverse bias is applied is prevented. Thus, an object is to provide a rectifier circuit whose reliability is increased and rectification efficiency is improved. A gate and a drain of a transistor are both connected to a terminal of the rectifier circuit to which an AC signal is input. In the transistor, an oxide semiconductor is used for a channel formation region and the off-state current at room temperature is less than or equal to $10^{-20}$ A/μm, which is equal to 10 zA/μm (z: zepto), when the source-drain voltage is 3.1 V.

19 Claims, 9 Drawing Sheets

(51) Int. Cl.
- *H01L 27/12* (2006.01)
- *H01L 27/06* (2006.01)
- *H01L 27/08* (2006.01)

(58) Field of Classification Search
USPC .................................... 363/123–127; 257/72
See application file for complete search history.

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,777,829 | B2 | 8/2004 | Devilbiss et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,109,934 | B2 | 9/2006 | Devilbiss et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,424,265 | B2 * | 9/2008 | Umeda .............. G06K 19/0723 340/10.4 |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,575,966 | B2 * | 8/2009 | Lai et al. ...................... 438/153 |
| 7,674,650 | B2 | 3/2010 | Akimoto et al. |
| 7,732,819 | B2 | 6/2010 | Akimoto et al. |
| 7,840,181 | B2 | 11/2010 | Umeda et al. |
| 7,890,054 | B2 | 2/2011 | Umeda et al. |
| 7,923,733 | B2 | 4/2011 | Kamata |
| 8,129,714 | B2 * | 3/2012 | Yano .................. H01L 51/0545 257/40 |
| 8,642,402 | B2 | 2/2014 | Yano et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2004/0245858 | A1 | 12/2004 | Devilbiss et al. |
| 2005/0017302 | A1 | 1/2005 | Hoffman |
| 2005/0199959 | A1 | 9/2005 | Chiang et al. |
| 2005/0282505 | A1 | 12/2005 | Umeda et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0158926 | A1 | 7/2008 | Umeda et al. |
| 2008/0166834 | A1 | 7/2008 | Kim et al. |
| 2008/0182358 | A1 | 7/2008 | Cowdery-Corvan et al. |
| 2008/0197344 | A1 * | 8/2008 | Yano .................. H01L 51/0545 257/40 |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0318523 | A1 | 12/2008 | Umeda et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0200557 | A1 | 8/2009 | Kamata |
| 2009/0278122 | A1 | 11/2009 | Hosono et al. |
| 2009/0280600 | A1 | 11/2009 | Hosono et al. |
| 2010/0001259 | A1 | 1/2010 | Saitho et al. |
| 2010/0055832 | A1 | 3/2010 | Akimoto et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0283055 | A1 * | 11/2010 | Inoue .................. H01L 29/7869 257/59 |
| 2011/0101789 | A1 * | 5/2011 | Salter et al. .................. 307/104 |
| 2011/0148835 | A1 * | 6/2011 | Yamazaki .................... 345/207 |
| 2011/0240988 | A1 | 10/2011 | Yano et al. |
| 2011/0310063 | A1 * | 12/2011 | Kurokawa .............. G06F 3/0421 345/175 |

FOREIGN PATENT DOCUMENTS

| | | |
|---|---|---|
| EP | 1852804 A | 11/2007 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2006-034085 A | 2/2006 |
| JP | 2008-011584 A | 1/2008 |
| JP | 2008-166749 A | 7/2008 |
| JP | 2008-311342 A | 12/2008 |
| JP | 2009-099847 A | 5/2009 |
| JP | 2009-212499 A | 9/2009 |
| TW | I292249 | 1/2008 |
| WO | WO-03/079524 | 9/2003 |
| WO | WO-2004/114391 | 12/2004 |
| WO | WO-2007/148653 | 12/2007 |
| WO | WO-2008/096768 | 8/2008 |
| WO | WO-2010/023889 | 3/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUs on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicaon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using CASTEP,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 0455001-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.
Cho.S et al., "Oxide TFT Rectifier with RF Antenna,", IDW '09 :Proceedings of the 16th International Display Workshops, Dec. 9, 2009, pp. 1815-1817.
International Search Report (Application No. PCT/JP2011/053597) Dated Apr. 26, 2011.
Written Opinion (Application No. PCT/JP2011/053597) Dated Apr. 26, 2011.
Taiwanese Office Action (Application No. 100106921) Dated May 11, 2015.

\* cited by examiner

PRIOR ART

RECTIFIER CIRCUIT INCLUDING TRANSISTOR WHOSE CHANNEL FORMATION REGION INCLUDES OXIDE SEMICONDUCTOR

TECHNICAL FIELD

The technical field relates to a rectifier circuit and a wireless communication device using the rectifier circuit.

BACKGROUND ART

In a wireless communication system using radio frequency identification (RFID) technology, when an antenna included in a data carrier receives a carrier wave transmitted from an antenna included in a reader/writer, an electromotive force is induced by electromagnetic induction. Then, a rectifier circuit included in the data carrier generates direct current from alternating current induced in the antenna.

In general, a rectifier circuit included in a data carrier includes a so-called diode-connected MOS transistor (hereinafter referred to as a "transistor") in which a gate is connected to a source or a drain. The rectifier circuit rectifies an AC signal to a DC signal.

In order to prevent breakdown of the diode-connected transistor included in the rectifier circuit, peak reverse voltage that is approximately three times as high as AC voltage to be rectified is needed. Here, the level of AC voltage input to the rectifier circuit included in the data carrier varies depending on the distance between the antenna of the reader/writer and the antenna of the data carrier. Therefore, it is necessary to select a transistor to be used in consideration of the maximum AC voltage input to the rectifier circuit.

FIG. 2 is a graph showing reverse-bias static characteristics of diode-connected transistors (whose channel formation regions are formed using polysilicon and off-state current is $10^{-9}$ A/μm) included in a rectifier circuit. Note that the horizontal axis represents voltage [V] and the vertical axis represents current [A]. According to the graph, when a reverse bias is applied to the diode-connected transistors, a breakdown phenomenon occurs with voltages of higher than −10 V and the transistors are broken.

Reverse current which flows in a reverse-bias state correlates with off-state current of the diode-connected transistor. A free electron in the reverse current is accelerated by an electric field and causes collisional ionization; thus, the breakdown phenomenon occurs.

Therefore, it is important to use a transistor whose off-state current is small as the diode-connected transistor included in the rectifier circuit in order to prevent breakdown of the transistor and increase reliability of the rectifier circuit.

By the way, it is known that a transistor in which an oxide semiconductor is used for a channel formation region has small off-state current.

In Non-Patent Document 1, a rectifier circuit including a transistor in which an oxide semiconductor is used for a channel formation region is proposed.

REFERENCE

Non-Patent Document

[Non-Patent Document 1] S. H. Cho, S. W. Kim, D. W. Ihm, B. S. Bae, D. H. Cho, C. W. Byun, C. S. Hwang, S. H. K. Park, "Oxide TFT Rectifier with RF Antenna", IDW'09, 2009, pp. 1815-1817

DISCLOSURE OF INVENTION

Non-Patent Document 1 discloses a full-wave voltage doubler rectifier circuit (FIG. 4(a) in Non-Patent Document 1) and a half-wave rectifier circuit (FIG. 4(b) in Non-Patent Document 1) each of which includes a transistor whose channel is formed using indium gallium zinc oxide (IGZO) and off-state current is $10^{-12}$ A/μm.

Here, a half-wave rectifier circuit is a circuit which rectifies only a half cycle of alternating current. In contrast, a full-wave voltage doubler rectifier circuit is a circuit in which two half-wave rectifier circuits are connected in series and which rectifies a full cycle of the alternating current including the remaining half cycle, which is not rectified by the half-wave rectifier circuit. Therefore, the output of the full-wave voltage doubler rectifier circuit is approximately twice as high as the output of the half-wave rectifier circuit.

However, when AC voltage with a voltage amplitude of 10 V is rectified by the full-wave voltage doubler rectifier circuit of Non-Patent Document 1 (FIG. 4(a) in Non-Patent Document 1), the resulting DC voltage is approximately 4.8 V (FIG. 5(a) in Non-Patent Document 1). When AC voltage with a voltage amplitude of 10 V is rectified by the half-wave rectifier circuit (FIG. 4(b) in Non-Patent Document 1), the resulting DC voltage is approximately 5 V (FIG. 5(b) in Non-Patent Document 1).

These results are analyzed in Non-Patent Document 1 as follows: since two high-resistance transistors (the transistors in which an oxide semiconductor is used for the channel formation regions) are used in the full-wave voltage doubler rectifier circuit (FIG. 4(a) in Non-Patent Document 1), the degree of voltage drop therein is higher than that in the half-wave rectifier circuit (FIG. 4(b) in Non-Patent Document 1) in which a single transistor is used.

The off-state current of the transistor disclosed in Non-Patent Document 1, in which an oxide semiconductor is used for the channel formation region, is $10^{-12}$ A/μm; this means that the transistor is resistant to breakdown due to application of a reverse bias as compared to a polysilicon transistor. However, characteristics of a normal rectifier circuit are not obtained in the transistor of Non-Patent Document 1 and the rectification efficiency is insufficient.

An object is to provide a rectifier circuit whose reliability is increased and rectification efficiency is improved by using a diode-connected transistor in which an oxide semiconductor is used for a channel formation region for prevention of breakdown of the transistor.

An embodiment of the present invention is a rectifier circuit including a transistor, a terminal to which an AC signal is input, a capacitor, and an output terminal. A gate of the transistor and one of a source and a drain of the transistor are electrically connected to the terminal to which an AC signal is input. The other of the source and the drain of the transistor and a first electrode of the capacitor are electrically connected to the output terminal. A ground potential is electrically connected to a second electrode of the capacitor. A channel formation region of the transistor includes an oxide semiconductor. The carrier density in the oxide semiconductor is lower than $1\times10^{14}/cm^3$.

Another embodiment of the present invention is a rectifier circuit including a transistor, a terminal to which an AC signal is input, a capacitor, and an output terminal. A gate of the transistor and one of a source and a drain of the transistor are electrically connected to the terminal to which an AC signal is input. The other of the source and the drain of the transistor and a first electrode of the capacitor are electrically connected to the output terminal. A ground potential is electrically connected to a second electrode of the capacitor. A channel formation region of the transistor includes an oxide semiconductor. The off-state current of the transistor at room temperature is less than or equal to 10 zA/μm when source-drain voltage is 3.1 V.

Another embodiment of the present invention is a method for manufacturing a rectifier circuit including a transistor, a terminal to which an AC signal is input, a capacitor, and an output terminal. In the rectifier circuit, a gate of the transistor and one of a source and a drain of the transistor are electrically connected to the terminal to which an AC signal is input, the other of the source and the drain of the transistor and a first electrode of the capacitor are electrically connected to the output terminal, and a ground potential is electrically connected to a second electrode of the capacitor. The method for manufacturing the rectifier circuit includes the steps of forming a channel formation region of the transistor with the use of a first oxide semiconductor; performing first heat treatment for removing hydrogen, water, and a hydroxyl group on the first oxide semiconductor so that a second oxide semiconductor is formed; and performing second heat treatment for repairing oxygen deficiency in the second oxide semiconductor in an oxygen atmosphere or an atmosphere including nitrogen and oxygen, successively to the first heat treatment, so that a third oxide semiconductor is formed. In the method for manufacturing the rectifier circuit, the third oxide semiconductor is used for the channel formation region of the transistor.

Another embodiment of the present invention is a rectifier circuit including a first transistor, a second transistor, a terminal to which an AC signal is input, a first capacitor, a second capacitor, and an output terminal A first electrode of the first capacitor is electrically connected to the terminal to which an AC signal is input. One of a source and a drain of the first transistor, a gate of the first transistor, and one of a source and a drain of the second transistor are electrically connected to a second electrode of the first capacitor. The other of the source and the drain of the first transistor and a first electrode of the second capacitor are electrically connected to the output terminal A ground potential, a gate of the second transistor, and the other of the source and the drain of the second transistor are electrically connected to a second electrode of the second capacitor. Channel formation regions of the first transistor and the second transistor include an oxide semiconductor. The carrier density in the oxide semiconductor is lower than $1\times10^{14}/cm^3$.

Another embodiment of the present invention is a rectifier circuit including a first transistor, a second transistor, a terminal to which an AC signal is input, a first capacitor, a second capacitor, and an output terminal A first electrode of the first capacitor is electrically connected to the terminal to which an AC signal is input. One of a source and a drain of the first transistor, a gate of the first transistor, and one of a source and a drain of the second transistor are electrically connected to a second electrode of the first capacitor. The other of the source and the drain of the first transistor and a first electrode of the second capacitor are electrically connected to the output terminal A ground potential, a gate of the second transistor, and the other of the source and the drain of the second transistor are electrically connected to a second electrode of the second capacitor. Channel formation regions of the first transistor and the second transistor include an oxide semiconductor. The off-state current of each of the first transistor and the second transistor at room temperature is less than or equal to 10 zA/μm when source-drain voltage is 3.1 V.

Another embodiment of the present invention is a method for manufacturing a rectifier circuit including a first transistor, a second transistor, a terminal to which an AC signal is input, a first capacitor, a second capacitor, and an output terminal. In the rectifier circuit, a first electrode of the first capacitor is electrically connected to the terminal to which an AC signal is input; one of a source and a drain of the first transistor, a gate of the first transistor, and one of a source and a drain of the second transistor are electrically connected to a second electrode of the first capacitor; the other of the source and the drain of the first transistor and a first electrode of the second capacitor are electrically connected to the output terminal; and a ground potential, a gate of the second transistor, and the other of the source and the drain of the second transistor are electrically connected to a second electrode of the second capacitor. The method for manufacturing the rectifier circuit includes the steps of forming channel formation regions of the first transistor and the second transistor with the use of a first oxide semiconductor; performing first heat treatment for removing hydrogen, water, and a hydroxyl group on the first oxide semiconductor so that a second oxide semiconductor is formed; and performing second heat treatment for repairing oxygen deficiency in the second oxide semiconductor in an oxygen atmosphere or an atmosphere including nitrogen and oxygen, successively to the first heat treatment, so that a third oxide semiconductor is formed. In the method for manufacturing the rectifier circuit, the third oxide semiconductor is used for the channel formation regions of the first transistor and the second transistor.

Another embodiment of the present invention is a wireless communication device including a transistor, a terminal to which an AC signal is input, a capacitor, an output terminal, and an antenna. A gate of the transistor and one of a source and a drain of the transistor are electrically connected to the terminal to which an AC signal is input. The other of the source and the drain of the transistor and a first electrode of the capacitor are electrically connected to the output terminal. A ground potential is electrically connected to a second electrode of the capacitor. The AC signal is a signal received by the antenna. A channel formation region of the transistor includes an oxide semiconductor. The carrier density in the oxide semiconductor is lower than $1\times10^{14}/cm^3$.

Another embodiment of the present invention is a wireless communication device including a transistor, a terminal to which an AC signal is input, a capacitor, an output terminal, and an antenna. A gate of the transistor and one of a source and a drain of the transistor are electrically connected to the terminal to which an AC signal is input. The other of the source and the drain of the transistor and a first electrode of the capacitor are electrically connected to the output terminal. A ground potential is electrically connected to a second electrode of the capacitor. The AC signal is a signal received by the antenna. A channel formation region of the transistor includes an oxide semiconductor. The off-state current of the transistor at room temperature is less than or equal to 10 zA/μm when source-drain voltage is 3.1 V.

Another embodiment of the present invention is a method for manufacturing a wireless communication device including a transistor, a terminal to which an AC signal is input, a capacitor, an output terminal, and an antenna. In the wireless communication device, a gate of the transistor and one of a source and a drain of the transistor are electrically connected to the terminal to which an AC signal is input, the other of the source and the drain of the transistor and a first electrode of the capacitor are electrically connected to the output terminal, a ground potential is electrically connected to a second electrode of the capacitor, and the AC signal is a signal received by the antenna. The method for manufacturing the wireless communication device includes at least the steps of forming a channel formation region of the transistor with the use of a first oxide semiconductor; performing first heat treatment for removing hydrogen, water, and a hydroxyl group on the first oxide semiconductor so that a second oxide semiconductor is formed; and performing second heat treatment for repairing oxygen deficiency in the second oxide semiconductor in an oxygen atmosphere or an atmosphere including nitrogen and oxygen, successively to the first heat treatment, so that a third oxide semiconductor is formed.

Another embodiment of the present invention is a wireless communication device including a first transistor, a second transistor, a terminal to which an AC signal is input, a first capacitor, a second capacitor, an output terminal, and an antenna. A first electrode of the first capacitor is electrically connected to the terminal to which an AC signal is input. One of a source and a drain of the first transistor, a gate of the first transistor, and one of a source and a drain of the second transistor are electrically connected to a second electrode of the first capacitor. The other of the source and the drain of the first transistor and a first electrode of the second capacitor are electrically connected to the output terminal. A ground potential, a gate of the second transistor, and the other of the source and the drain of the second transistor are electrically connected to a second electrode of the second capacitor. The AC signal is a signal received by the antenna. Channel formation regions of the first transistor and the second transistor include an oxide semiconductor. The carrier density in the oxide semiconductor is lower than $1 \times 10^{14}/cm^3$.

Another embodiment of the present invention is a wireless communication device including a first transistor, a second transistor, a terminal to which an AC signal is input, a first capacitor, a second capacitor, an output terminal, and an antenna. A first electrode of the first capacitor is electrically connected to the terminal to which an AC signal is input. One of a source and a drain of the first transistor, a gate of the first transistor, and one of a source and a drain of the second transistor are electrically connected to a second electrode of the first capacitor. The other of the source and the drain of the first transistor and a first electrode of the second capacitor are electrically connected to the output terminal. A ground potential, a gate of the second transistor, and the other of the source and the drain of the second transistor are electrically connected to a second electrode of the second capacitor. The AC signal is a signal received by the antenna. Channel formation regions of the first transistor and the second transistor include an oxide semiconductor. The off-state current of each of the first transistor and the second transistor at room temperature is less than or equal to 10 zA/μm when source-drain voltage is 3.1 V.

Another embodiment of the present invention is a method for manufacturing a wireless communication device including a first transistor, a second transistor, a terminal to which an AC signal is input, a first capacitor, a second capacitor, an output terminal, and an antenna. In the wireless communication device, a first electrode of the first capacitor is electrically connected to the terminal to which an AC signal is input; one of a source and a drain of the first transistor, a gate of the first transistor, and one of a source and a drain of the second transistor are electrically connected to a second electrode of the first capacitor; the other of the source and the drain of the first transistor and a first electrode of the second capacitor are electrically connected to the output terminal; a ground potential, a gate of the second transistor, and the other of the source and the drain of the second transistor are electrically connected to a second electrode of the second capacitor; and the AC signal is a signal received by the antenna. The method for manufacturing the wireless communication device includes the steps of forming channel formation regions of the first transistor and the second transistor with the use of a first oxide semiconductor; performing first heat treatment for removing hydrogen, water, and a hydroxyl group on the first oxide semiconductor so that a second oxide semiconductor is formed; and performing second heat treatment for repairing oxygen deficiency in the second oxide semiconductor in an oxygen atmosphere or an atmosphere including nitrogen and oxygen, successively to the first heat treatment, so that a third oxide semiconductor is formed. In the method for manufacturing the wireless communication device, the third oxide semiconductor is used for the channel formation regions of the first transistor and the second transistor.

Another embodiment of the present invention is a wireless communication device including any of the above rectifier circuits.

A rectifier circuit in which dielectric breakdown is difficult to occur can be provided. Accordingly, the lifetime of a wireless communication device including the rectifier circuit can be increased.

BEST MODE FOR CARRYING OUT THE INVENTION

Embodiment 1

Figure 1A:
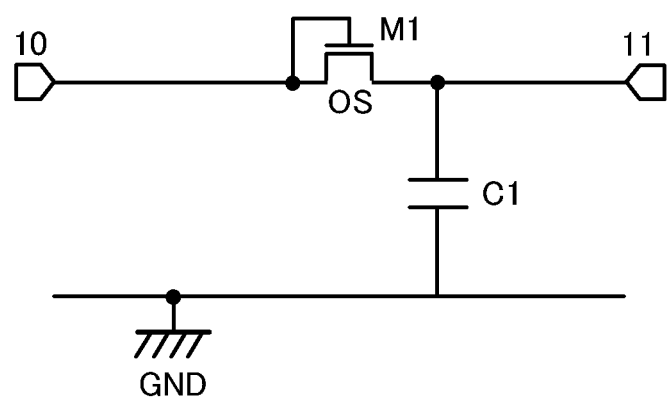
FIGS. 1A and 1B are circuit diagrams illustrating configurations of rectifier circuits.

As a transistor included in a rectifier circuit, a transistor described below is used, in which an oxide semiconductor that is purified and made electrically i-type (intrinsic) or substantially i-type (intrinsic) is used for a channel formation region.

<Transistor in which Oxide Semiconductor is Used for Channel Formation Region>

An oxide semiconductor disclosed in this specification will be described. Impurities such as hydrogen, water, a hydroxyl group, or hydroxide (also referred to as a hydrogen compound) which serve as donors are intentionally removed from the oxide semiconductor included in the transistor, and then oxygen which is simultaneously reduced in the step of removing these impurities is supplied, so that the oxide semiconductor is purified and made electrically i-type (intrinsic) or substantially i-type (intrinsic). The purpose of this treatment is to suppress fluctuation in electric characteristics of the transistor.

Hydrogen included in the oxide semiconductor is removed as much as possible; thus, the carrier density in the oxide semiconductor is lower than $1 \times 10^{14}/cm^3$, preferably lower than $1 \times 10^{12}/cm^3$, further preferably lower than $1 \times 10^{10}/cm^3$.

In an oxide semiconductor, which is a wide bandgap semiconductor, the density of the minority carrier is low and the minority carrier is difficult to be induced. Thus, it can be said that, in the transistor in which an oxide semiconductor is used for the channel formation region, tunneling current is difficult to be generated; consequently, off-state current is difficult to flow.

In addition, impact ionization and avalanche breakdown are less likely to occur in the transistor in which the oxide semiconductor, which is a wide bandgap semiconductor, is used for the channel formation region. The hot carrier deterioration is mainly caused by increase in the number of carriers due to avalanche breakdown and by injection of the carriers accelerated to high speed to a gate insulating film. Therefore, it can be said that the transistor in which an oxide semiconductor is used for the channel formation region has resistance to hot carrier deterioration.

Note that in this specification, off-state current refers to current that flows between a source and a drain of an n-channel transistor whose threshold voltage Vth is positive when a given gate voltage of higher than or equal to −20 V and lower than or equal to −5 V is applied at room temperature. Note that the room temperature refers to a temperature of higher than or equal to 15° C. and lower than or equal to 25° C.

The current value per micrometer in a channel width W at room temperature of the transistor in which an oxide semiconductor that is purified and made electrically i-type (intrinsic) or substantially i-type (intrinsic) is used for the channel formation region is less than or equal to $10^{-16}$ A/μm, preferably less than or equal to $10^{-18}$ A/μm, which is equal to 1 zA/μm (a: atto), further preferably less than or equal to $10^{-21}$ A/μm, which is equal to 1 zA/μm (z: zepto).

<Result of Measurement of Off-State Current>

Results of measurement of off-state current of a transistor in which an oxide semiconductor that is purified and made electrically i-type (intrinsic) or substantially i-type (intrinsic) is used for a channel formation region will be described.

Figure 3:
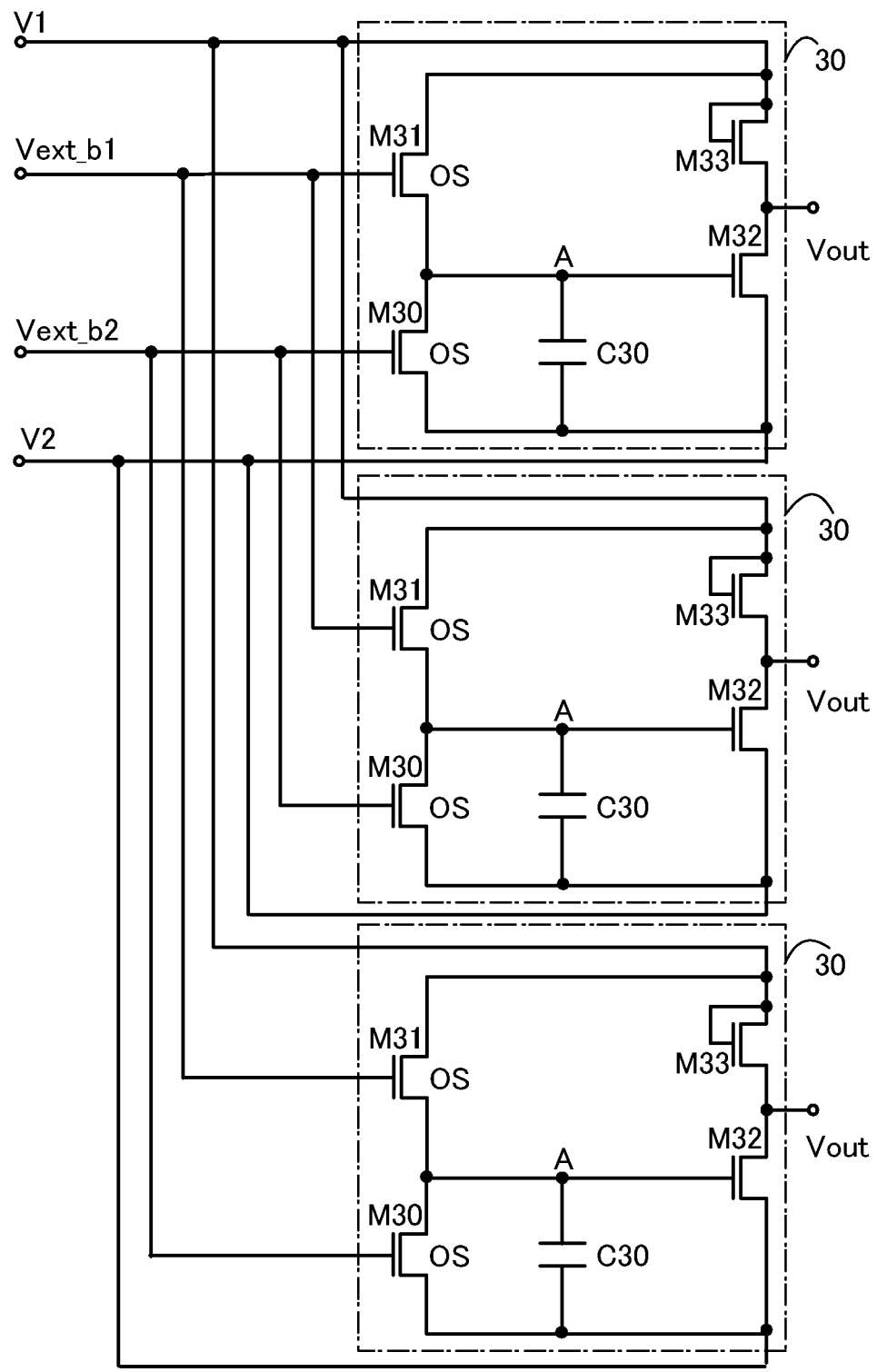
FIG. 3 is a diagram of a circuit for evaluating characteristics of a transistor in which an oxide semiconductor is used for a channel formation region.

First, an element for characteristic evaluation which is used for a method for measuring current will be described with reference to FIG. 3. In the element for characteristic evaluation in FIG. 3, three measurement systems 30 are connected in parallel. Each of the measurement systems 30 includes a capacitor C30, transistors M30 and M31 in which an oxide semiconductor that is purified and made electrically i-type (intrinsic) or substantially i-type (intrinsic) is used for channel formation regions, and transistors M32 and M33.

One of a source and a drain of the transistor M30 is connected to a power source which supplies voltage V2. The other of the source and the drain of the transistor M30 is connected to one of a source and a drain of the transistor M31. A gate of the transistor M30 is connected to a wiring through which voltage Vext_b2 is supplied.

The other of the source and the drain of the transistor M31 is connected to a power source which supplies voltage V1. A gate of the transistor M31 is connected to a wiring through which voltage Vext_b1 is supplied.

One of a source and a drain of the transistor M32 is connected to the power source which supplies the voltage V2. The other of the source and the drain of the transistor M32 is connected to an output terminal A gate of the transistor M32 is connected to one terminal of the capacitor C30.

One of a source and a drain of the transistor M33 is connected to the output terminal. The other of the source and the drain of the transistor M33 is connected to a gate thereof.

The other terminal of the capacitor C30 is connected to the power source which supplies the voltage V2.

Next, a method for measuring current with the use of the element for characteristic evaluation illustrated in FIG. 3 will be described. First, an initial period in which a potential difference is applied to measure the off-state current will be described. In the initial period, the voltage Vext_b1 with which the transistor M31 is turned on is input to the gate of the transistor M31, so that the transistor M31 is turned on. Consequently, the voltage V1 is input to a node A which is a node connected to the other of the source and the drain of the transistor M30 (i.e., a node connected to the one of the source and the drain of the transistor M31, the one terminal of the capacitor C30, and the gate of the transistor M32). Here, the voltage V1 is high voltage. In addition, the transistor M30 is off.

After that, the voltage Vext_b1 with which the transistor M31 is turned off is input to the gate of the transistor M31, so that the transistor M31 is turned off. After the transistor M31 is turned off, the voltage V1 is set to low. Here, the transistor M30 is still off. The voltage V2 as well as the voltage V1 is set to low.

In the above manner, the initial period is completed. In the state where the initial period is completed, a potential difference is generated between the node A and the one of the source and the drain of the transistor M30. Further, a potential difference is generated between the node A and the other of the source and the drain of the transistor M31. Accordingly, electric charge slightly flows through the transistor M30 and the transistor M31. That is, off-state current is generated.

Next, a measurement period of the off-state current will be described. In the measurement period, the voltage V1 and the voltage V2 are both fixed to low. In addition, the node A is in a floating state. As a result, electric charge flows through the transistor M30, and the amount of electric charge stored in the node A is changed as time passes. In other words, the potential of the node A is changed and output potential $V_{out}$ of the output terminal is also changed.

Next, a method for calculating the off-state current on the basis of the obtained output potential $V_{out}$ will be described. A potential $V_A$ of the node A is expressed by Formula 1 as a function of the output potential $V_{out}$.

[Formula 1]

$$V_A = F(V_{out}) \qquad (1)$$

Electric charge $Q_A$ of the node A is expressed by Formula 2.

[Formula 2]

$$Q_A = C_A V_A + \text{const} \quad (2)$$

$C_A$: capacitance connected to the node A (the sum of the capacitance of the capacitor C30 and the other capacitance).

Current $I_A$ of the node A can be obtained by differentiating electric charge flowing to the node A (or electric charge flowing from the node A) with respect to time. Accordingly, the current $I_A$ of the node A is expressed by Formula 3.

[Formula 3]

$$I_A \equiv \frac{\Delta Q_A}{\Delta t} = \frac{C_A \cdot \Delta F(V_{out})}{\Delta t} \quad (3)$$

In current measurement described below, the transistors M30 and M31 in the element for characteristic evaluation are each a transistor in which an oxide semiconductor that is purified and made electrically i-type (intrinsic) or substantially i-type (intrinsic) is used for the channel formation region. In each of the transistors, W/L is 50/10 [μm]. In addition, in the measurement systems 30 connected in parallel, respective capacitance values of the capacitors C30 are 100 fF, 1 pF, and 3 pF.

The high voltage is set at 5 V, and the low voltage is set at 0 V. The voltage V1 is basically low in the measurement period; the voltage V1 is set to high for only 100 msec in every 10 sec to 300 sec because an output circuit needs to be operated at a timing of measuring the output potential $V_{out}$. In addition, Δt in Formula 3 is approximately 30000 [sec].

Figure 4:
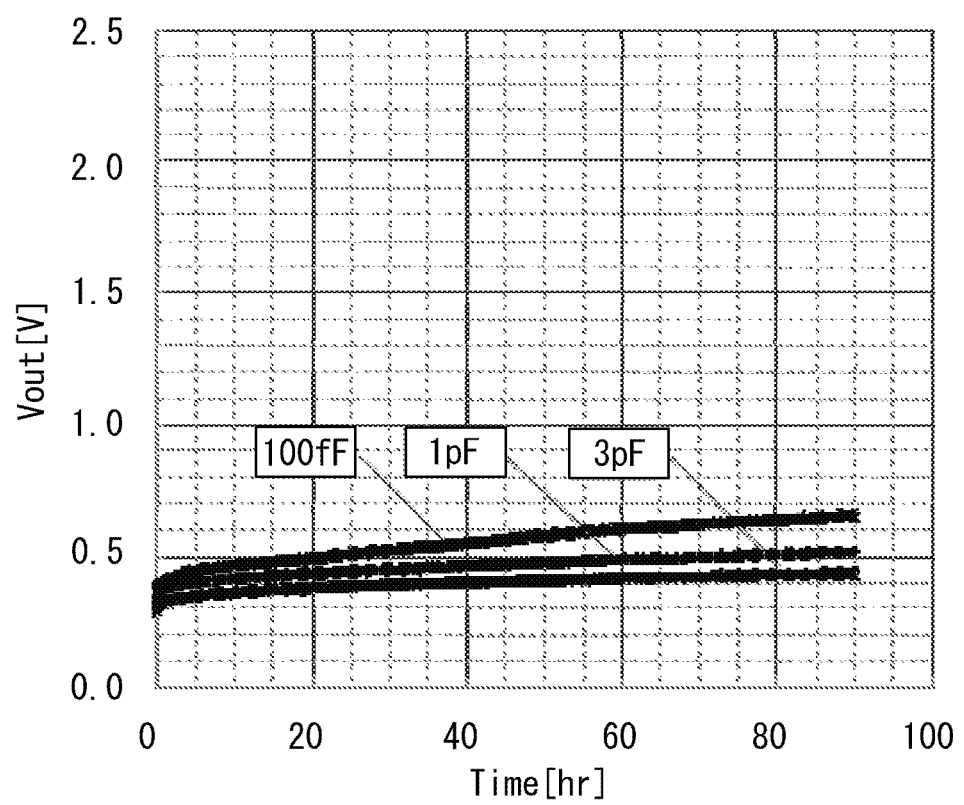
FIG. 4 is a graph showing characteristics of a transistor in which an oxide semiconductor is used for a channel formation region.

FIG. 4 shows the relation between elapsed time Time in the current measurement and the output potential $V_{out}$. According to FIG. 4, the potential is changed as time passes.

Figure 5:
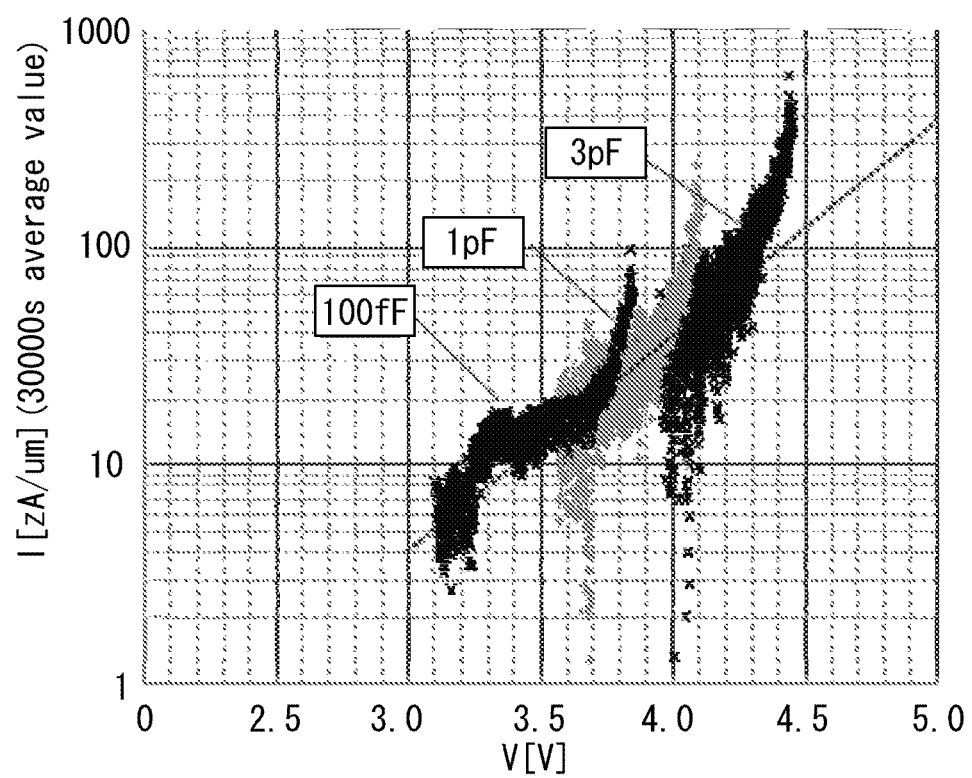
FIG. 5 is a graph showing characteristics of a transistor in which an oxide semiconductor is used for a channel formation region.

FIG. 5 shows the off-state current at room temperature (25° C.) calculated on the basis of the current measurement. Note that FIG. 5 shows the relation between source-drain voltage V and off-state current I. According to FIG. 5, the off-state current I is approximately 40 zA/μm when the source-drain voltage is 4 V. In addition, the off-state current is less than or equal to 10 zA/μm when the source-drain voltage is 3.1 V.

Figure 6:
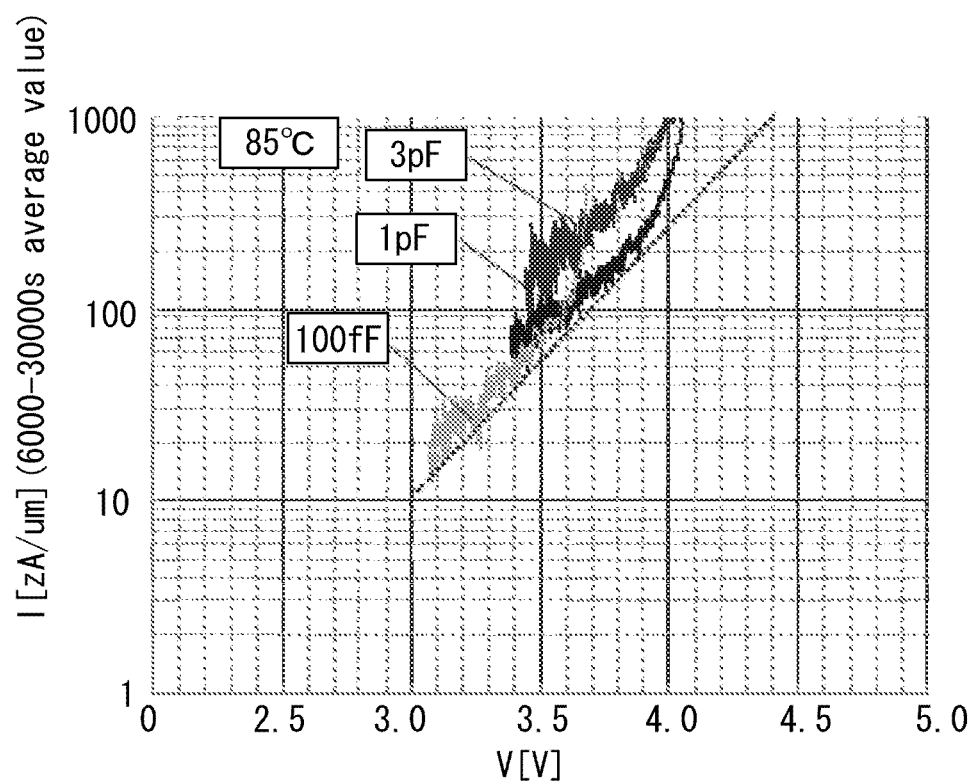
FIG. 6 is a graph showing characteristics of a transistor in which an oxide semiconductor is used for a channel formation region.

FIG. 6 shows the off-state current in an environment at a temperature of 85° C., which is calculated on the basis of the current measurement. FIG. 6 shows the relation between the source-drain voltage V and the off-state current I in the environment at a temperature of 85° C. According to FIG. 6, the off-state current is less than or equal to 100 zA/μm when the source-drain voltage is 3.1 V.

<Configuration of Rectifier Circuit>

A rectifier circuit illustrated in FIG. 1A includes a transistor M1, a terminal 10 to which an AC signal is input, a capacitor C1, and an output terminal 11 and has the following configuration. A gate of the transistor M1 and one of a source and a drain of the transistor M1 are electrically connected to the terminal 10 to which an AC signal is input. The other of the source and the drain of the transistor M1 and a first electrode of the capacitor C1 are electrically connected to the output terminal 11. A ground potential is electrically connected to a second electrode of the capacitor C1.

The rectifier circuit rectifies an AC signal input to the terminal 10 and outputs a DC signal from the terminal 11. This rectifier circuit includes the capacitor C1 and the diode-connected transistor M1 in which an oxide semiconductor that is purified and made electrically i-type (intrinsic) or substantially i-type (intrinsic) is used for a channel formation region.

Figure 1B:
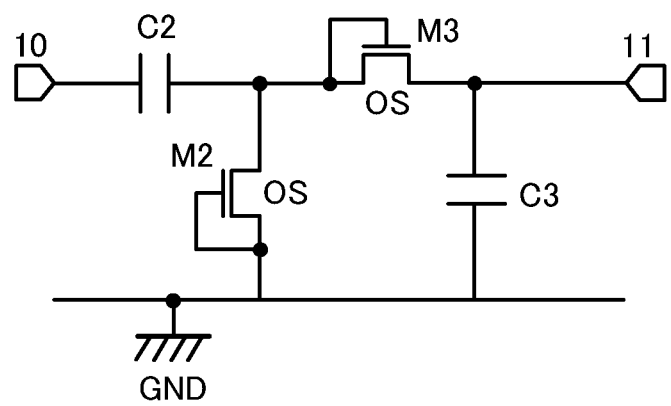
Figure 2:
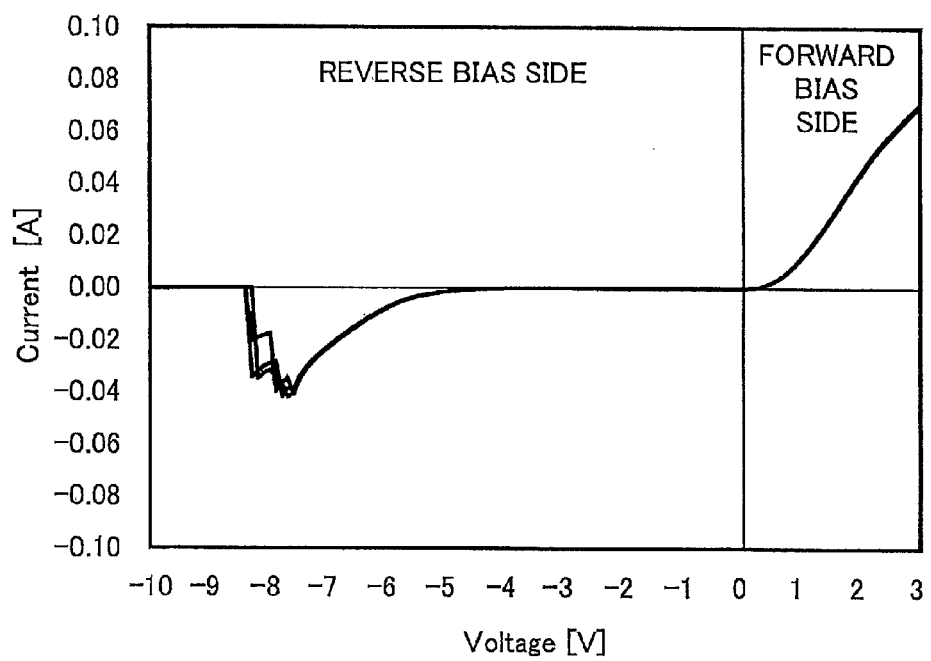
FIG. 2 is a graph showing reverse-bias static characteristics of diode-connected transistors included in a rectifier circuit.

Note that in FIGS. 1A and 1B, "OS" is written beside a circuit symbol that represents a transistor in order to show that the transistor is the one in which an oxide semiconductor is used for a channel formation region.

A rectifier circuit illustrated in FIG. 1B includes a first transistor M3, a second transistor M2, the terminal 10 to which an AC signal is input, a first capacitor C2, a second capacitor C3, and the output terminal 11 and has the following configuration. A first electrode of the capacitor C2 is electrically connected to the terminal 10 to which an AC signal is input. One of a source and a drain of the transistor M3, a gate of the transistor M3, and one of a source and a drain of the transistor M2 are electrically connected to a second electrode of the capacitor C2. The other of the source and the drain of the transistor M3 and a first electrode of the capacitor C3 are electrically connected to the output terminal 11. A ground potential, a gate of the transistor M2, and the other of the source and the drain of the transistor M2 are electrically connected to a second electrode of the capacitor C3.

The rectifier circuit rectifies an AC signal input to the terminal 10 and outputs a DC signal from the terminal 11. This rectifier circuit includes the capacitors C2 and C3 and the diode-connected transistors M2 and M3 in which an oxide semiconductor that is purified and made electrically i-type (intrinsic) or substantially i-type (intrinsic) is used for channel formation regions.

Figure 7:
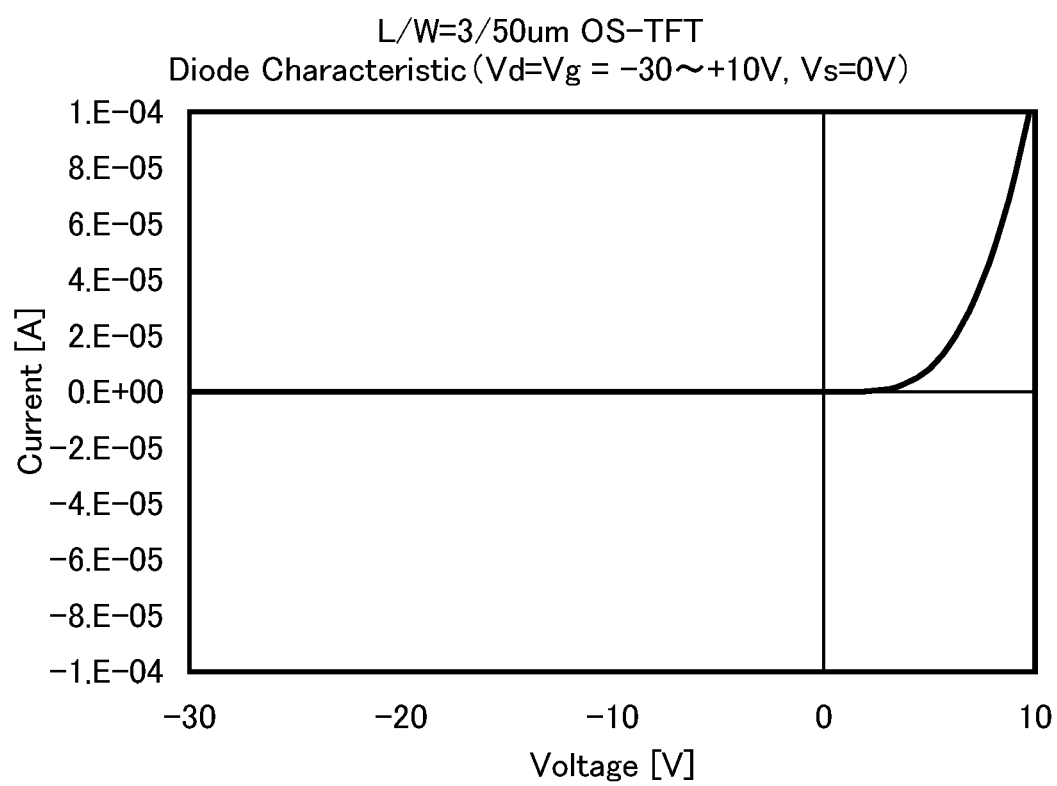
FIG. 7 is a graph showing a diode characteristic of a diode-connected transistor in which an oxide semiconductor is used for a channel formation region.

FIG. 7 is a graph showing a diode characteristic of a diode-connected transistor in which an oxide semiconductor that is purified and made electrically i-type (intrinsic) or substantially i-type (intrinsic) is used for a channel formation region. This graph shows that even when a reverse-bias voltage of −30 V is applied, a breakdown phenomenon does not occur and the transistor is not broken.

A loss of power P in the rectifier circuit is expressed by Formula 4.

[Formula 4]

$$P = I^2 R_{DS(ON)} \quad (4)$$

I: current, $R_{DS(ON)}$: on-state resistance of transistor.

According to Formula 4, the higher the on-state resistance (the smaller the on-state current) of the transistor is, the more the loss of power in the rectifier circuit is.

Here, drain current $I_{DS}$ of the transistor in a saturation region is expressed by Formula 5.

[Formula 5]

$$I_{DS} = \frac{\mu C W (V_G - V_{TH})^2}{2L} \quad (5)$$

μ: mobility, C: capacitance per unit area of gate oxide film, W: channel width, $V_G$: gate voltage, $V_{TH}$: threshold voltage, L: channel length.

According to Formula 5, the following first to third conditions need to be satisfied in order to increase the on-state current of the transistor. The first condition is improvement in the mobility μ. The second condition is reduction in the channel length L. The third condition is increase in the channel width W.

That is, increase in the channel width W and the on-state current of the transistor can be given as one of way for reducing the loss of power. However, since the value of the channel width W also correlates with the value of the off-state current, there is a limit on the value of the channel width W. As described above, when a transistor whose off-state current is large is used in a rectifier circuit, the possibility of dielectric breakdown due to a breakdown phenomenon or heat generation is increased.

Here, the off-state current at room temperature of the transistor in which an oxide semiconductor that is purified and made electrically i-type (intrinsic) or substantially i-type (intrinsic) is used for the channel formation region is less than or equal to 10 zA/μm when the source-drain voltage is 3.1 V.

It is assumed that the on-state current of the transistor is increased by three orders of magnitude by increasing the channel width W thereof, for example. In this case, the off-state current is also increased by three orders of magnitude; however, the off-state current is still less than or equal to $10^{-18}$ A/μm. This value is smaller than $10^{-9}$ A/μm, which is the off-state current of a transistor in which polysilicon is used for a channel formation region, and it can be said that the transistor in which the oxide semiconductor is used for the channel formation region is difficult to be broken.

Accordingly, by providing the transistor in which an oxide semiconductor that is purified and made electrically i-type (intrinsic) or substantially i-type (intrinsic) is used for the channel formation region in a rectifier circuit, a rectifier circuit in which the loss of power is small, that is, the rectification efficiency is excellent and dielectric breakdown is difficult to occur can be provided.

Embodiment 2

An example of a method for manufacturing a transistor in which an oxide semiconductor that is purified and made electrically i-type (intrinsic) or substantially i-type (intrinsic) is used for a channel formation region will be described with reference to FIGS. 8A to 8E.

First, an insulating layer 101 is formed as a base film over a substrate 100. The insulating layer 101 is preferably formed while residual moisture is removed from a treatment chamber. This is to prevent hydrogen, water, a hydroxyl group, hydrate, or the like from being included in the insulating layer 101.

Next, an oxide semiconductor layer is formed over the insulating layer 101 by a sputtering method. Before forming the oxide semiconductor layer, the substrate 100 provided with the insulating layer 101 is preferably pre-heated. This is to prevent hydrogen, water, and a hydroxyl group from being included in the oxide semiconductor layer as much as possible. Impurities such as hydrogen or water absorbed in the substrate 100 are removed and exhausted by the pre-heating.

A metal oxide target including zinc oxide as a main component can be used as a target for the oxide semiconductor layer. For example, a target having a composition ratio of $In_2O_3$:$Ga_2O_3$:ZnO=1:1:1, that is, In:Ga:Zn=1:1:0.5 can be used. Other than this, a target having a composition ratio of In:Ga:Zn=1:1:1 or In:Ga:Zn=1:1:2 can be used.

Further, a metal oxide such as In—Sn—Ga—Zn—O, In—Sn—Zn—O, In—Al—Zn—O, Sn—Ga—Zn—O, Al—Ga—Zn—O, Sn—Al—Zn—O, In—Zn—O, Sn—Zn—O, Al—Zn—O, Zn—Mg—O, Sn—Mg—O, In—Mg—O, In—O, Sn—O, or Zn—O can be used as a target.

Further, a thin film expressed by $InMO_3(ZnO)_m$ (m>0 and m is not a natural number) may be used as the oxide semiconductor layer. Here, M is one or more metal elements selected from Ga, Al, Mn, and Co. For example, Ga, Ga and Al, Ga and Mn, or Ga and Co may be used as M.

Figure 8A:
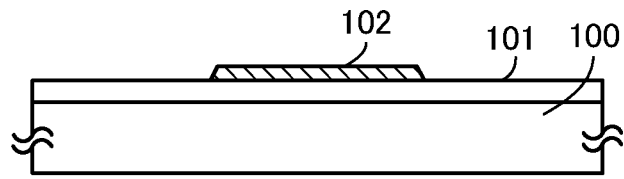
FIGS. 8A to 8E are views illustrating an example of a method for manufacturing a transistor.

The formed oxide semiconductor layer is processed into an island-shaped oxide semiconductor layer 102 by a first photolithography process (see FIG. 8A). Then, in order to remove hydrogen, water, a hydroxyl group, and the like from the oxide semiconductor layer 102, the substrate is introduced into an electric furnace and heated. This heat treatment has an effect of dehydration or dehydrogenation of the oxide semiconductor layer 102.

A temperature for performing the heat treatment is higher than or equal to 400° C. and lower than or equal to 750° C., preferably higher than or equal to 400° C. and lower than a strain point of the substrate. Further, the heat treatment is performed in an atmosphere that does not include water, hydrogen, or the like.

After the heat treatment, it is preferable that the oxide semiconductor layer 102 be successively heated in an oxygen atmosphere or an atmosphere including nitrogen and oxygen (e.g., the volume ratio of nitrogen:oxygen=4:1). This is to repair oxygen deficiency, which occurs in the oxide semiconductor layer 102.

Figure 8B:
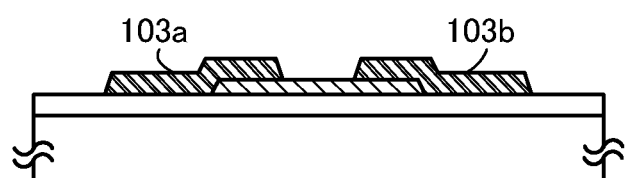

Then, a first electrode 103a and a second electrode 103b are formed over the insulating layer 101 and the oxide semiconductor layer 102 (see FIG. 8B). The first electrode 103a functions as one of a source electrode and a drain electrode. The second electrode 103b functions as the other of the source electrode and the drain electrode.

Figure 8C:
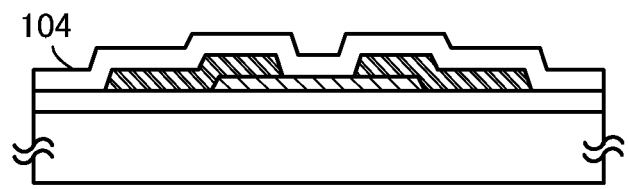

Next, a gate insulating layer 104 is formed over the insulating layer 101, the oxide semiconductor layer 102, the first electrode 103a, and the second electrode 103b (see FIG. 8C). Note that it is preferable that hydrogen be not included in an atmosphere in which the gate insulating layer 104 is formed.

Figure 8D:
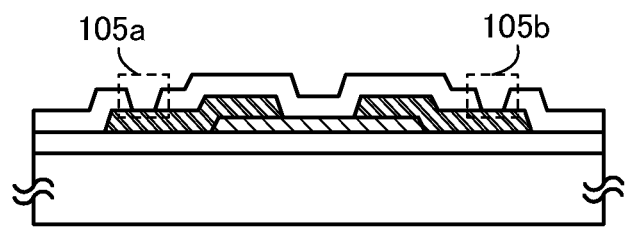

Next, openings 105a and 105b reaching the first electrode 103a and the second electrode 103b are formed by removing part of the gate insulating layer 104 (see FIG. 8D).

Figure 8E:
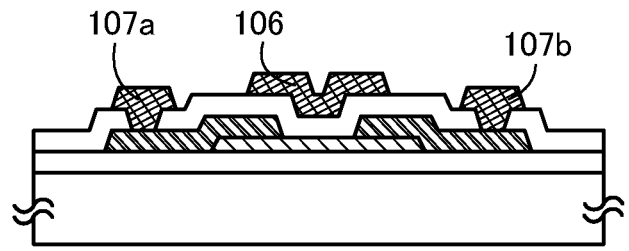

Then, a gate electrode 106, a first wiring 107a, and a second wiring 107b are formed over the gate insulating layer 104 and the openings 105a and 105b (see FIG. 8E).

In the above manner, the transistor in which an oxide semiconductor that is purified and made electrically i-type (intrinsic) or substantially i-type (intrinsic) is used for a channel formation region can be manufactured.

Example 1

Figure 9A:
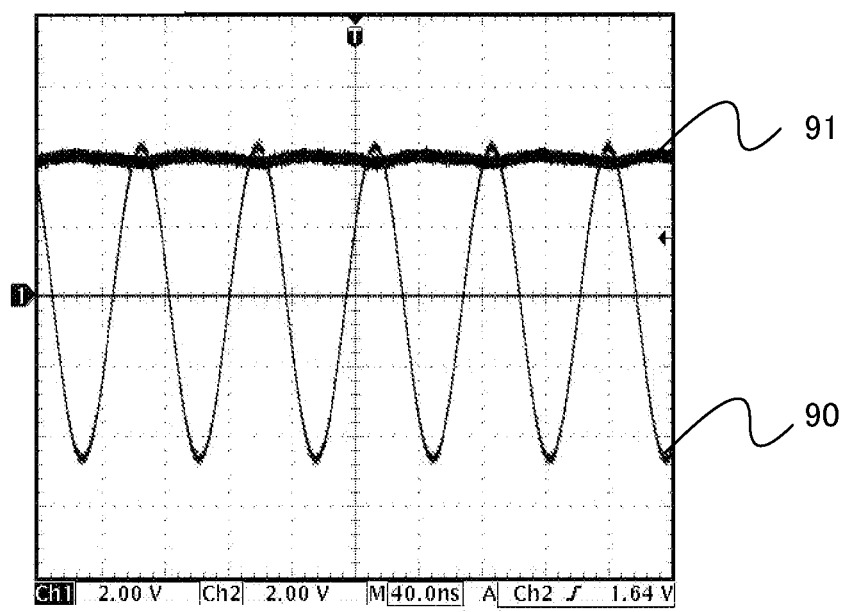
FIGS. 9A and 9B are graphs showing input voltage and output voltage of rectifier circuits.

FIG. 9A shows measurement data of AC voltage input to the half-wave rectifier circuit in FIG. 1A and output DC voltage obtained by rectifying the AC voltage.

As for the size of the transistor M1 in FIG. 1A, W/L is 5000/5 [μm]. The capacitance value of the capacitor C1 is 300 pF.

A graph 90 is a graph of input AC voltage. The voltage amplitude is approximately 10 V. A graph 91 is a graph of output DC voltage. In the graph 91, ripples are small and an average value of 3.91 V is obtained.

Figure 9B:
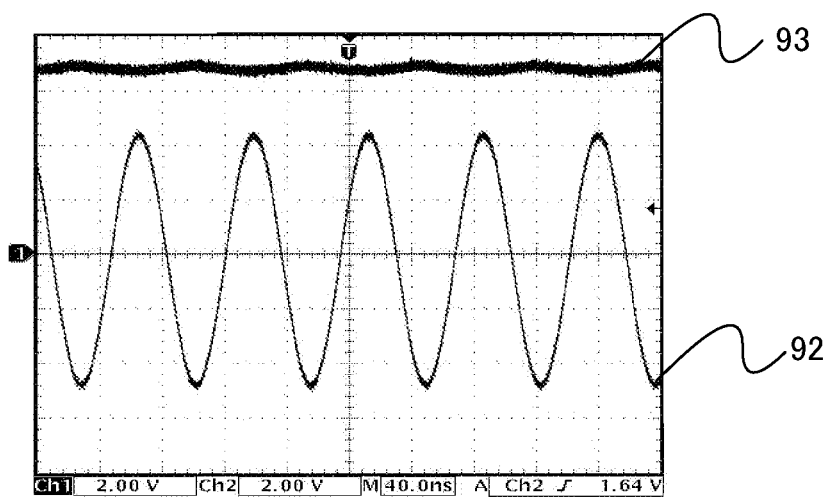

FIG. 9B shows measurement data of AC voltage input to the half-wave voltage doubler rectifier circuit in FIG. 1B and output DC voltage obtained by rectifying the AC voltage.

As for the size of each of the transistors M2 and M3 in FIG. 1B, W/L is 5000/5 [μm]. The capacitance values of the capacitors C2 and C3 are each 300 pF.

A graph 92 is a graph of input AC voltage. The voltage amplitude is approximately 10 V. A graph 93 is a graph of output DC voltage. In the graph 93, ripples are small and an average value of 6.80 V is obtained.

Thus, with a rectifier circuit including a transistor in which an oxide semiconductor that is purified and made electrically i-type (intrinsic) or substantially i-type (intrinsic) is used for a channel formation region, high-quality DC current in which the loss of power is small and ripples are reduced can be obtained. In other words, the rectification efficiency of the rectifier circuit can be improved.

This application is based on Japanese Patent Application serial no. 2010-049159 filed with Japan Patent Office on Mar. 5, 2010, the entire contents of which are hereby incorporated by reference.

The invention claimed is:

1. A rectifier circuit comprising:
a transistor;
an input terminal;
a capacitor; and
an output terminal,
wherein a gate of the transistor and one of a source and a drain of the transistor are electrically connected to the input terminal,
wherein the gate of the transistor is directly connected to the one of the source and the drain of the transistor,
wherein the other of the source and the drain of the transistor and an electrode of the capacitor are electrically connected to the output terminal,
wherein the transistor comprises a channel formation region comprising an oxide semiconductor, and
wherein off-state current of the transistor at room temperature is less than or equal to 10 zA/μm when source-drain voltage is 3.1V.

2. The rectifier circuit according to claim 1,
wherein a carrier density in the oxide semiconductor is lower than $1 \times 10^{12}/cm^3$.

3. The rectifier circuit according to claim 1,
wherein the oxide semiconductor is purified by removing impurities and supplying oxygen.

4. The rectifier circuit according to claim 1,
wherein the transistor comprises:
an oxide semiconductor layer over an insulating layer, the oxide semiconductor layer comprising the channel formation region;
a source electrode over the oxide semiconductor layer and the insulating layer;
a drain electrode over the oxide semiconductor layer and the insulating layer;
a gate insulating layer over the oxide semiconductor layer, the source electrode and the drain electrode, the gate insulating layer comprising a first opening and a second opening; and
a gate electrode over the gate insulating layer,
wherein a part of the source electrode is in contact with the insulating layer,
wherein a part of the drain electrode is in contact with the insulating layer,
wherein a first wiring over the gate insulating layer is in contact with the part of the source electrode through the first opening, and
wherein a second wiring over the gate insulating layer is in contact with the part of the drain electrode through the second opening.

5. A rectifier circuit comprising:
a first transistor;
a second transistor;
an input terminal;
a first capacitor;
a second capacitor; and
an output terminal,
wherein a first electrode of the first capacitor is electrically connected to the input terminal,
wherein one of a source and a drain of the first transistor, a gate of the first transistor, and one of a source and a drain of the second transistor are electrically connected to a second electrode of the first capacitor,
wherein the other of the source and the drain of the first transistor and a first electrode of the second capacitor are electrically connected to the output terminal,
wherein a gate of the second transistor, and the other of the source and the drain of the second transistor are electrically connected to a second electrode of the second capacitor,
wherein each of the first transistor and the second transistor comprises a channel formation region comprising an oxide semiconductor, and
wherein off-state current of each of the first transistor and the second transistor at room temperature is less than or equal to 10 zA/μm when source-drain voltage is 3.1 V.

6. The rectifier circuit according to claim 5,
wherein a carrier density in the oxide semiconductor is lower than $1 \times 10^{12}/cm^3$.

7. The rectifier circuit according to claim 5,
wherein the oxide semiconductor is purified by removing impurities and supplying oxygen.

8. The rectifier circuit according to claim 5,
wherein the gate of the first transistor is directly connected to the one of the source and the drain of the first transistor, and
wherein the gate of the second transistor is directly connected to the other of the source and the drain of the second transistor.

9. The rectifier circuit according to claim 5,
wherein the first transistor comprises:
an oxide semiconductor layer over an insulating layer, the oxide semiconductor layer comprising the channel formation region;
a source electrode over the oxide semiconductor layer and the insulating layer;
a drain electrode over the oxide semiconductor layer and the insulating layer;
a gate insulating layer over the oxide semiconductor layer, the source electrode and the drain electrode, the gate insulating layer comprising a first opening and a second opening; and
a gate electrode over the gate insulating layer,
wherein a part of the source electrode is in contact with the insulating layer,
wherein a part of the drain electrode is in contact with the insulating layer,
wherein a first wiring over the gate insulating layer is in contact with the part of the source electrode through the first opening, and
wherein a second wiring over the gate insulating layer is in contact with the part of the drain electrode through the second opening.

10. A wireless communication device comprising:
an antenna, and
a rectifier circuit comprising:
a transistor;
an input terminal;
a capacitor; and
an output terminal, wherein a gate of the transistor and one of a source and a drain of the transistor are electrically connected to the input terminal, wherein the other of the source and the drain of the transistor and an electrode of the capacitor are electrically connected to the output terminal, wherein the transistor comprises a channel formation region comprising an oxide semiconductor, wherein off-state current of the transistor at room temperature is less than or equal to 10 zA/μm when source-drain voltage is 3.1 V, and wherein an AC signal received by the antenna is inputted into the input terminal.

11. The wireless communication device according to claim 10, wherein a carrier density in the oxide semiconductor is lower than $1 \times 10^{12}/cm^3$.

12. The wireless communication device according to claim 10, wherein the oxide semiconductor is purified by removing impurities and supplying oxygen.

13. The wireless communication device according to claim 10, wherein the gate of the transistor is directly connected to the one of the source and the drain of the transistor.

14. The wireless communication device according to claim 10, wherein the transistor comprises:

an oxide semiconductor layer over an insulating layer, the oxide semiconductor layer comprising the channel formation region;

a source electrode over the oxide semiconductor layer and the insulating layer;

a drain electrode over the oxide semiconductor layer and the insulating layer;

a gate insulating layer over the oxide semiconductor layer, the source electrode and the drain electrode, the gate insulating layer comprising a first opening and a second opening; and a gate electrode over the gate insulating layer, wherein a part of the source electrode is in contact with the insulating layer, wherein a part of the drain electrode is in contact with the insulating layer, wherein a first wiring over the gate insulating layer is in contact with the part of the source electrode through the first opening, and wherein a second wiring over the gate insulating layer is in contact with the part of the drain electrode through the second opening.

15. A wireless communication device comprising:
an antenna, and
a rectifier circuit comprising:
a first transistor;
a second transistor;
an input terminal;
a first capacitor;
a second capacitor; and
an output terminal,
wherein a first electrode of the first capacitor is electrically connected to the input terminal, wherein one of a source and a drain of the first transistor, a gate of the first transistor, and one of a source and a drain of the second transistor are electrically connected to a second electrode of the first capacitor, wherein the other of the source and the drain of the first transistor and a first electrode of the second capacitor are electrically connected to the output terminal, wherein a gate of the second transistor, and the other of the source and the drain of the second transistor are electrically connected to a second electrode of the second capacitor, wherein each of the first transistor and the second transistor comprises a channel formation region comprising an oxide semiconductor, wherein off-state current of each of the first transistor and the second transistor at room temperature is less than or equal to 10 zA/μm when source-drain voltage is 3.1 V, and wherein an AC signal received by the antenna is inputted into the input terminal.

16. The wireless communication device according to claim 15, wherein a carrier density in the oxide semiconductor is lower than $1 \times 10^{12}/cm^3$.

17. The wireless communication device according to claim 15, wherein the oxide semiconductor is purified by removing impurities and supplying oxygen.

18. The wireless communication device according to claim 15, wherein the gate of the first transistor is directly connected to the one of the source and the drain of the first transistor, and wherein the gate of the second transistor is directly connected to the other of the source and the drain of the second transistor.

19. The wireless communication device according to claim 15, wherein the first transistor comprises:

an oxide semiconductor layer over an insulating layer, the oxide semiconductor layer comprising the channel formation region;

a source electrode over the oxide semiconductor layer and the insulating layer;

a drain electrode over the oxide semiconductor layer and the insulating layer;

a gate insulating layer over the oxide semiconductor layer, the source electrode and the drain electrode, the gate insulating layer comprising a first opening and a second opening; and a gate electrode over the gate insulating layer, wherein a part of the source electrode is in contact with the insulating layer, wherein a part of the drain electrode is in contact with the insulating layer, wherein a first wiring over the gate insulating layer is in contact with the part of the source electrode through the first opening, and wherein a second wiring over the gate insulating layer is in contact with the part of the drain electrode through the second opening.

* * * * *